United States Patent
Hightower et al.

(10) Patent No.: US 8,541,726 B2
(45) Date of Patent: *Sep. 24, 2013

(54) DIODELESS TERRESTRIAL PHOTOVOLTAIC SOLAR POWER ARRAY

(75) Inventors: Charles H. Hightower, San Clemente, CA (US); Jeff E. Frericks, Anaheim Hills, CA (US); Authi Ariamuthu Narayanan, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/589,000

(22) Filed: Aug. 17, 2012

(65) Prior Publication Data
US 2013/0140911 A1    Jun. 6, 2013

Related U.S. Application Data

(63) Continuation of application No. 12/571,123, filed on Sep. 30, 2009, now Pat. No. 8,263,920.

(51) Int. Cl.
*G01C 21/02* (2006.01)
*H01L 31/042* (2006.01)

(52) U.S. Cl.
USPC ......................... 250/203.4; 136/246

(58) Field of Classification Search
USPC .................. 250/203.4; 136/244, 246
See application file for complete search history.

(56) References Cited

U.S. PATENT DOCUMENTS

| | | |
|---|---|---|
| 2004/0123894 A1 | 7/2004 | Erban |
| 2005/0172995 A1 | 8/2005 | Rohrig et al. |
| 2007/0107767 A1 | 5/2007 | Hayden et al. |

FOREIGN PATENT DOCUMENTS

| | | |
|---|---|---|
| EP | 2110729 A1 | 10/2009 |
| WO | WO 9533283 A1 * | 12/1995 |
| WO | WO 2008/096019 A1 | 8/2008 |

OTHER PUBLICATIONS

PCT International Search Report for PCT/US2010/044199, Applicant: The Boeing Company, Form PCT/ISA/210 and 220, dated Oct. 24, 2011 (5 pages).
PCT Written Opinion of the International Search Authority for PCT/US2010/044199, Applicant: The Boeing Company, Form PCT/ISA/237, dated Oct. 24, 2011 (7 pages).
Hightower, Charles H. and Narayanan, Authi, "Maximum Power Tracker Functionality Enhancements Leading to Diodeless Photovoltaic Solar Power Array with Automatic Output Power Optimization," white paper presented Jun. 1, 2009.

* cited by examiner

*Primary Examiner* — Thanh Luu
(74) *Attorney, Agent, or Firm* — Vista IP Law Group LLP; Cynthia A. Dixon

(57) ABSTRACT

A method and device are disclosed for diodeless terrestrial photovoltaic solar power arrays. In one or more embodiments, the method and device involve a solar power array device without blocking diodes and/or without bypass diodes. The method comprises providing a solar module, a solar array tracker, a power bus, a controller, and an inverter. In one or more embodiments, the method further comprises providing a circuit breaker and/or a bi-position switch. When the controller senses that the solar module power is below a threshold level, the controller commands the solar tracker to vary the solar module's pointing until the solar module is operating at its maximum power point for the solar module's level of illumination. In some embodiments, when the controller senses that the solar module power is less than a minimum bypass threshold level, the controller commands a bi-position switch to bypass current around the solar module.

20 Claims, 6 Drawing Sheets

DIODELESS TERRESTRIAL PHOTOVOLTAIC SOLAR POWER ARRAY

CROSS-REFERENCE TO RELATED APPLICATION

This application is a Continuation application of, and claims the benefit of, U.S. patent application Ser. No. 12/571,123, filed Sep. 30, 2009, which is hereby incorporated by reference in its entirety.

BACKGROUND

The present disclosure relates to photovoltaic solar power arrays. In particular, it relates to diodeless terrestrial photovoltaic solar power arrays.

SUMMARY

The present disclosure relates to a device, apparatus, system, and method for diodeless terrestrial photovoltaic solar power arrays. In one or more embodiments, the method for providing diodeless terrestrial photovoltaic solar power arrays involves a solar power array device without blocking diodes. This method comprises providing a solar module, and connecting a solar array tracker and a circuit breaker to the solar module. The method further comprises connecting a power bus and a controller to the circuit breaker, and connecting an inverter to the power bus. Further, the method comprises sensing with the controller the output voltage and current of the solar module. When the controller senses the solar module is producing power below a power threshold level, the controller sends a signal to the solar array tracker to vary the solar module's pointing until the solar module is operating at its maximum power point for the solar module's level of illumination. And, when the controller senses that shadowing on the solar module is less than a minimum shadowing threshold level, the controller sends a command to the circuit breaker to prevent current flow into the solar module, thereby preventing harm to cells of the solar module.

In one or more embodiments, the inverter is a direct current/alternating current (DC/AC) inverter. In some embodiments, the solar module contains a plurality of solar cells. In at least one embodiment, the plurality of solar cells are connected in series. In alternative embodiments, the plurality of solar cells are connected in parallel. In one or more embodiments, the plurality of solar cells are connected in parallel-series combination. In at least one embodiment, the solar module contains only one solar cell.

In some embodiments, the method for providing diodeless terrestrial photovoltaic solar power arrays involves a solar power array device without bypass diodes. This method comprises providing a solar module, and connecting a solar array tracker and a bi-position switch to the solar module. The method further comprises connecting a power bus and a controller to the bi-position switch, and connecting an inverter to the power bus. Further, the method comprises, sensing with the controller the output voltage and current of the solar module. When the controller senses the solar module is producing power below a power threshold level, the controller sends a signal to the solar array tracker to vary the solar module's pointing until the solar module is operating at its maximum power point for the solar module's level of illumination. And, when the controller senses that the maximum power of the solar module is less than a minimum bypass threshold level, the controller sends a command to the bi-position switch to bypass current around the solar module, thereby maximizing solar power array efficiency. In one or more embodiments, the bi-position switch is a latching solenoid. In some embodiments, the at bi-position switch is a latching relay. In at least one embodiment, the bi-position switch is a read relay.

In one or more embodiments, the method for providing diodeless terrestrial photovoltaic solar power arrays involves a solar power array device without blocking diodes and without bypass diodes. This method comprises providing a solar module; and connecting a solar array tracker, a circuit breaker, and a bi-position switch to the solar module. The method further comprises connecting a power bus and a controller to the circuit breaker and the bi-position switch. The method also comprises connecting an inverter to the power bus, and sensing with the controller the output voltage and current of the solar module. When the controller senses the solar module is producing power below a power threshold level, the controller sends a signal to the solar array tracker to vary the solar module's pointing until the solar module is operating at its maximum power point for the solar module's level of illumination. And, when the controller senses that shadowing on the solar module is less than a minimum shadowing threshold level, the controller sends a command to the circuit breaker to prevent current flow into the solar module, thereby preventing harm to cells of the solar module. Also, when the controller senses that the maximum power of the solar module is less than a minimum bypass threshold level, the controller sends a command to the bi-position switch to bypass current around the solar module, thereby maximizing solar power array efficiency.

In some embodiments, the device for diodeless terrestrial photovoltaic solar power arrays involves a solar power array device without blocking diodes. This device comprises a solar module, a solar array tracker, a circuit breaker, a power bus, a controller, and an inverter. The controller of this device senses output voltage and current of the solar module. When the controller senses the solar module is producing power below a power threshold level, the controller sends a signal to the solar array tracker to vary the solar module's pointing until the solar module is operating at its maximum power point for the solar module's level of illumination. And, when the controller senses that shadowing on the solar module is less than a minimum shadowing threshold level, the controller sends a command to the circuit breaker to prevent current flow into the solar module, thereby preventing harm to cells of the solar module.

DRAWINGS

These and other features, aspects, and advantages of the present disclosure will become better understood with regard to the following description, appended claims, and accompanying drawings where:

DESCRIPTION

Figure 1:
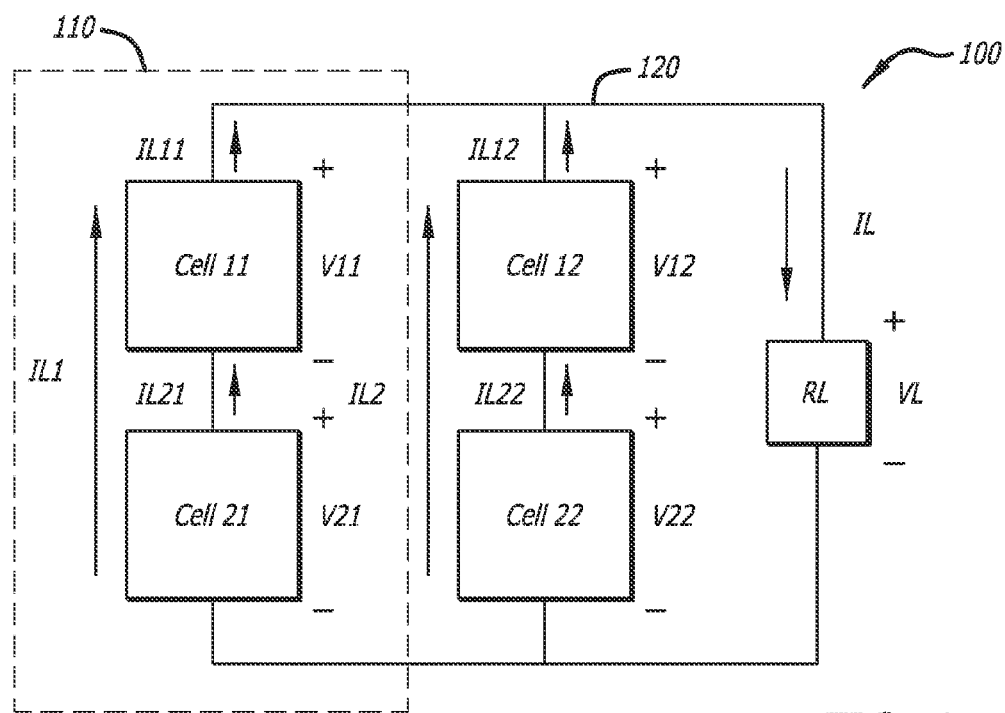
FIG. 1 is an illustration of a model photovoltaic solar power plant showing no current flowing from the unshadowed string of solar cells to the shadowed string of solar cells, in accordance with at least one embodiment of the present disclosure.

The methods, devices, and apparatus disclosed herein provide an operative system for photovoltaic solar power arrays. Specifically, this system allows for diodeless terrestrial photovoltaic solar power arrays. The disclosed system is used to monitor the output voltage and current of a terrestrial solar array. The system sends control signals to a tracking system and direct current/alternating current (DC/AC) inverter in order to maximize output power. In addition, if the system senses an abnormal voltage or current condition, the system sends commands to isolate the solar power array's output bus. This system effectively provides functions of bypass and blocking diodes and, in addition, provides intelligence and control for the overall solar power array.

The system of the present disclosure consists of a sensor and controller, which controls an array or field of photovoltaic (PV) cells in such a manner that solar cell bypass diodes and/or blocking diodes are not required. The cost of the solar power array is greatly reduced with the elimination of blocking diodes and/or bypass diodes. In addition, the elimination of bypass diodes and/or blocking diodes from a solar power array design can lead to a slight improvement in power generation efficiency and greater solar power array reliability.

Generally, terrestrial solar power arrays use bypass diodes to shunt current around failed cells. And, blocking diodes are typically used by terrestrial solar power arrays to limit the current that can flow into a shadowed array if it is connected in parallel with one or more arrays that are not shadowed. Shadowing occurs when the level of sunlight that falls on one or two of the arrays, in a chain of many arrays, is reduced by clouds. In this situation, the solar cells will still produce power, but at a greatly reduced level. Under these circumstances, current from the unshadowed arrays can flow into the shadowed arrays' solar cells and potentially cause harm to the cells. When current flows to the solar cells in this fashion, the cells act as light emitting diodes (LEDs), and will glow if the current is high enough. This is not normally a problem at room temperature, but rather is typically a problem at higher temperatures associated with a concentrated photovoltaic (CPV) system because this high current can cause damage to the solar cells. The system of the present disclosure prevents "LED current" from flowing to a shadowed array by using a unique property associated with the operation of multiple arrays connected in parallel.

In one or more embodiments, three features of the disclosed system allow for the elimination of bypass and/or blocking diodes in terrestrial solar arrays. These features are: (1) operation of a shadowed array at or near its maximum power point (i.e., maximum current at maximum power (Imp), maximum voltage at maximum power (Vmp)) corresponding to its reduced level of illumination, thereby preventing current from flowing into it from other arrays connected in parallel that are not as heavily shadowed, (2) sensing the array's current and voltage in combination with a controller, which can open a circuit breaker automatically when a fault condition is detected, thereby protecting the array cells from harm, and (3) sensor and control functions are able to be integrated into the array's existing maximum power pointing and tracking electronics and software. Although the system of the present disclosure allows for the elimination of both types of these diodes, it is not necessary to eliminate both types of these diodes from the solar power array design. If certain situations dictate a need for blocking diodes, bypass diodes may be eliminated, and vice versa.

FIG. 1 depicts a simple solar array model 100 that is used to demonstrate the first feature, which allows for the avoidance of potentially harmful light emitting diode (LED) current flow into a shadowed array 110. In particular, FIG. 1 is an illustration of a model photovoltaic solar power plant 100 showing no current flowing from the unshadowed string 120 of solar cells (Cell 12, Cell 22) to the shadowed string 110 of solar cells (Cell 11, Cell 21), in accordance with at least one embodiment of the present disclosure. In this figure, the photovoltaic (PV) solar power plant model 100 consists of two parallel strings 110, 120 of cells (Cell 11, Cell 21, Cell 12, Cell 22), where each string of cells includes two solar cells connected in series. It should be noted that solar power arrays with more parallel strings and/or more series cells behave similarly to this model. The cells (Cell 11, Cell 21) in the left string 110 are shadowed, and are assumed to be receiving only 1% of the energy that the second string 120 is receiving from the sun. The solar cells (Cell 11, Cell 21, Cell 12, Cell 22) provide power to a load (RL). This model is used to demonstrate that as long as the shadowed string 110 is operating near its maximum peak power point, current from the unshadowed string 120 will not flow into the shadowed string 110, and potentially harm the shadowed string's cells (Cell 11, Cell 21).

Figure 2:
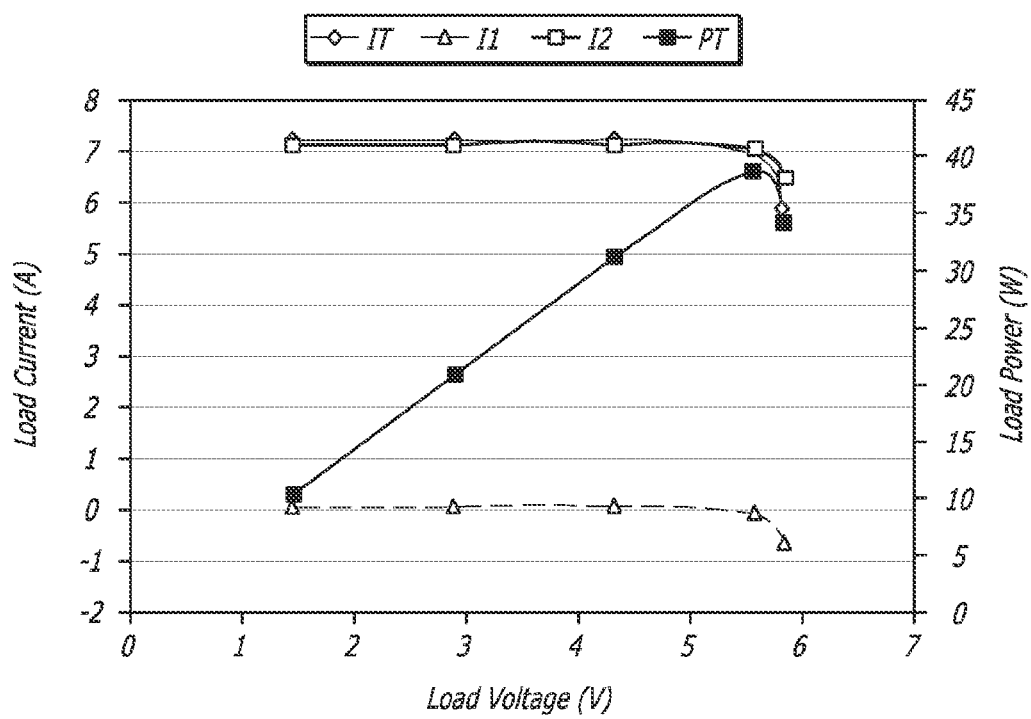
FIG. 2 is a graph showing that, for a model solar power array, current in the shadowed string of solar cells is always greater than zero for operation below the maximum power point, in accordance with at least one embodiment of the present disclosure.

The current-voltage (IV) curves for each string 110, 120, the total current, and the total power for the array are shown in FIG. 2. Specifically, FIG. 2 is a graph showing that, for a model solar power array 100, current in the shadowed string 110 of solar cells is always greater than zero for operation below the maximum power point. In this figure, the unshadowed string 120 (I2 on graph) is shown to produce 7.1 Amps, while the current produced by the shadowed string 110 (I1 on graph) is 71 milli Amps (mA) below the maximum power point (PT on graph). And, the total current for the system is shown in curve IT on the graph. In this situation, the shadowed string 110 is not substantially contributing to the power production, and could be eliminated from the circuit without impacting the total power output significantly (1% was chosen arbitrarily, and the real percentage could be higher or lower). It should be noted that the current in the shadowed string 110 (I1 on graph)) remains positive to the left of the maximum power point.

If the operating point shifts to the right of the maximum power point, then current flow reverses direction and current from the unshadowed string 120 flows through to the cells (Cell 11, Cell 21) in the opposite direction. If the current is large enough, the cells (Cell 11, Cell 21) act as light emitting diodes (LEDs) and will create photons. The amount of current flowing through the shadowed string 110 in the LED direction depends on cell characteristics, and may or may not cause cell damage. In any event, one of the main purposes of the present system is to prevent this LED current situation from occurring by ensuring that the total solar power array system is operating at or near its maximum power point.

The system of the present disclosure senses the current through the shadowed string 110 along with its voltage, and determines if the power being produced by the string 110 is below a threshold level. If the power is above the threshold level, then the controller does nothing. If the power output is below the threshold level (indicating that LED current may be imminent), the controller commands the array's tracking system to find the pointing direction that maximizes the string's output power. It should be noted that this not necessary if the solar power array already includes a maximum power tracker. If the power remains below the threshold level, the controller communicates with an inverter, and commands it to increase its load (i.e., lower its internal resistance), which increases current flow from the shadowed string 110. However, if the inverter shuts down, or is not operating at its maximum power point, the controller will open the shadowed string's 110 circuit breaker until the controller senses that the string 110 is no longer shadowed. The controller can determine if the string 110 is no longer shadowed by sensing the string's 110 voltage, which is an indicator of solar illumination.

The second feature, which allows for the elimination of blocking diodes, will now be discussed in detail. If an abnormal current or voltage is sensed by the solar power array exceeding a threshold level, which may be either positive or negative, the controller commands an array circuit breaker to open, thereby preventing any damage to the array. The circuit breaker can be reset manually or automatically, which may depend on the solar power plant's operating procedure. In one or more embodiments, the circuit breaker may be replaced by a properly sized fuse, if system considerations show that this is a more economical approach. If a failure mode exists that cannot be avoided with this implementation, then it may be cost effective to include a few spare arrays in the power system to replace the few that might be damaged by a rare event, thereby still avoiding the need for employing blocking diodes.

The third feature, which involves integration of the disclosed system into existing array electronics and software, will now be discussed in detail. Current array tracker systems include electronics that sense array bus voltage and current flow. This sensed data is used to point the array with a solar tracker. A central processing unit (CPU) is used to process this data and issue the related commands. In one or more embodiments, the system of the present disclosure requires that a software module be included that recognizes when current through an array is beginning to reverse due to shadowing, and issues commands to ensure that the solar tracker and/or DC/AC inverter maintain operation at the solar power array's maximum power point. In addition, in at least one embodiment, the disclosed system also requires software to analyze the current and voltage data in order to identify abnormal bus conditions, and to command the circuit breaker to open in a case when a fault is detected.

The elimination of blocking diodes in the present system is possible cause of the unique characteristics of strings of arrays connected in parallel that are operating at or near their maximum operating power point. That is, by maintaining operation near this point, current from fully illuminated arrays (strings) will not flow into shadowed arrays (strings) and potentially damage the shadowed cells.

Figure 3:
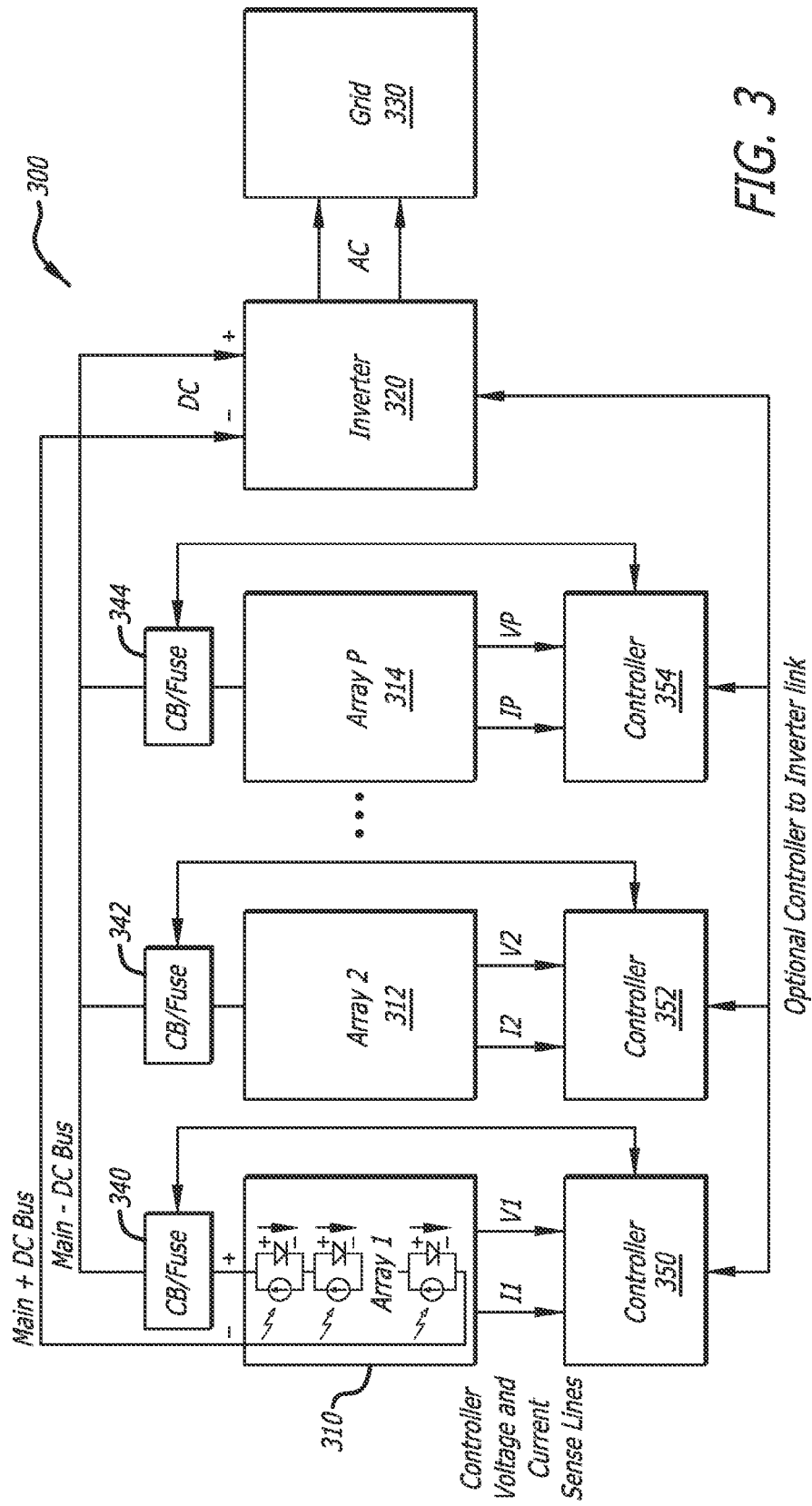
FIG. 3 is a depiction of a concentrated photovoltaic (CPV) solar power facility without bypass or blocking diodes, in accordance with at least one embodiment of the present disclosure.

FIG. 3 is a depiction of a concentrated photovoltaic (CPV) solar power facility 300 without bypass or blocking diodes, in accordance with at least one embodiment of the present disclosure. In particular, FIG. 3 shows a block diagram of a solar power element containing P arrays 310, 312, 314 connected in parallel that are connected to a DC/AC inverter 320, which is feeding power to a grid 330 (commercial power lines or combined with other inverter outputs). In this figure, the array 310, 312, 314 solar cells do not include bypass diodes, and the blocking diodes are replaced by a circuit breaker (CB) 340, 342, 344 (or a fuse in the simplest case) that is operated by a controller 350, 352, 354. Each controller 350, 352, 354 senses its own array's 310, 312, 314 output voltage and current (i.e., I1 and V1 in the first array 310; I2 and V2 in the second array 312; IP and VP in the P array 314). If the array 310, 312, 314 is producing power below a given threshold level, it sends a signal to the tracker to vary the array's 310, 312, 314 pointing slightly until the array 310, 312, 314 is operating at the maximum power point for the array's 310, 312, 314 level of illumination. It should be noted that this procedure is the same operation used for the maximum power tracker function. If shadowing on the array 310, 312, 314 is less than a minimum threshold level, the controller 350, 352, 354 sends a command to the CB 340, 342, 344 to open the connection to the main positive power bus, thereby preventing current from flowing into the array 310, 312, 314 and harming the cells.

When the array's 310, 312, 314 open circuit voltage exceeds a threshold level, this indicates that the array 310, 312, 314 is no longer shadowed, and the controller 350, 352, 354 sends a command to the CB 340, 342, 344 to close the circuit. The controller 350, 352, 354 then optimizes the array's 310, 312, 314 power operating point until the next shadowing event occurs. An optional connection between the controllers 350, 352, 354 and inverter 320 is shown because the maximum power point can also be controlled by the inverter 320, thereby eliminating the need for each controller 350, 352, 354 to iterate its array 310, 312, 314 pointing to locate this power point. If this is a normal operating mode of the inverter 320, this optional connection is not necessary.

If a ground fault or other circuit anomaly occurs, the controller 350, 352, 354 senses it, and opens the circuit breaker 340, 342, 344. The circuit breaker 340, 342, 344 can also operate autonomously in the event of an anomaly, and will notify the controller 350, 352, 354 of this action. A fuse is shown as an alternative to the CB 340, 342, 344 for fault isolation if the solar cells can withstand a reverse LED current that is above the fuse flash point. With fuses implemented in the system, in the case of a fault, the fuse would have to be replaced, and the cause of the fault would have to be eliminated. The controller 350, 352, 354 will also sense an open circuit failure, and will disconnect the array 310, 312, 314 from the bus since the array 310, 312, 314 will not produce any power in this state. The source of the failure can then be identified and repaired during routine maintenance.

Figure 4:
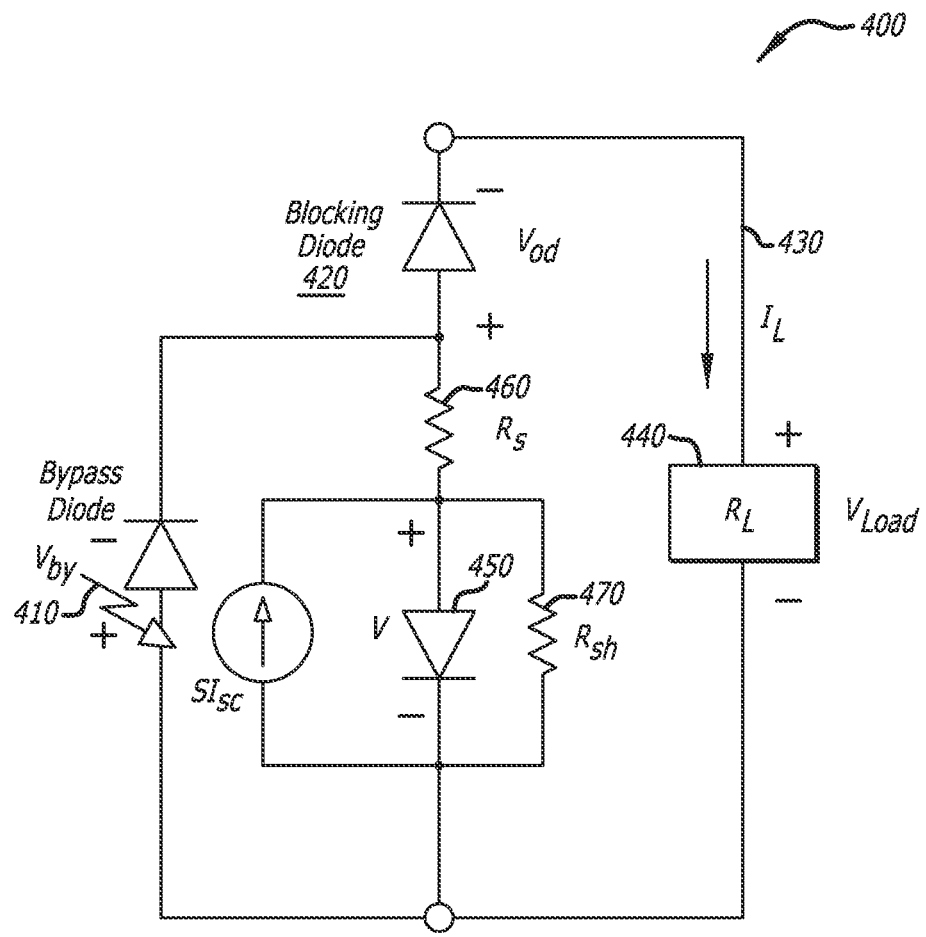
FIG. 4 is an illustration of a conventional solar cell model, which includes external diodes for current and voltage output.

In one or more embodiments, a solar array typically comprises a number of solar cells that are connected in series. A plurality of solar cells that are grouped together are often referred to as a "module." FIG. 4 is an illustration of a conventional solar cell model 400, which includes external diodes 410, 420 for current and voltage output. The model for the current-voltage relationship of a single solar cell 400, which is shown in FIG. 4, with an illumination factor of S ($0 \leq S \leq 1$) is given by the following relationship:

$$I_{cell} = SI_{sc} - I_o \left\{ \exp\left[\frac{q(V_{Load} - \Delta V + I_{cell} R_s)}{mkT}\right] - 1 \right\} - \frac{V_{Load} - \Delta V + I_{cell} R_s}{R_{sh}} \quad (2\text{-}1)$$

where, $$\Delta V = (1-S)I_{sc}R_s$$

$$V = V_{Load} + I_{sc}R_s$$

$I_o$=dark current
q=electron charge
m=cell ideality factor
k=Boltzmann's constant
V=voltage across cell diode
$V_{Load}$=load voltage
S=shadowing factor
$I_{sc}$=short current produced by the cell
$R_s$=cell's series resistance
$R_{sh}$=cell's shunt resistance.

The ΔV term describes the shift in the current-voltage (IV) curve to higher values of voltage that occurs as the light intensity decreases. The voltage term V is the bias voltage across the solar cell's 400 photovoltaic junction that controls the current flow through the solar cell 400.

The single solar cell model 400 is also applicable to solar cells 400 with multiple junctions if the proper model parameters are chosen (e.g., for a three junction cell, the ideality factor is about 3). The direction of the current $I_{cell}(I_L)$ 430 is out of the device into the positive side of the load (RL) 440. Electronically, the solar cell 400 is equivalent to a current generator connected in parallel with an asymmetric, non-linear resistive element, i.e., a diode. When illuminated, the solar cell 400 produces a photocurrent proportional to the light intensity. The photocurrent is divided between the variable resistance of the diode 450 and the load 440, in a ratio that depends on the resistance of the load 440 and the intensity of the illumination. For higher resistances, more of the photocurrent flows through the diode 450, resulting in a higher potential difference between the solar cell 400 terminals, but a smaller current through the load 440. The diode 450 provides the "photovoltage." Without the diode 450, there is nothing to drive the current through the load 440 (i.e., no potential difference occurs across the load 440). The series 460 and shunt 470 resistances affect the shape of the solar cell's 400 IV characteristic.

If the solar cell 400 is connected to a variable voltage source, the load voltage can be increased or its polarity inverted. If the voltage is increased high enough, the solar cell 400 ceases to function as a solar cell 400, and instead operates as a light emitting diode (LED). If the voltage across the solar cell 400 is negative, the solar cell 400 acts as a photo detector, consuming power to generate photocurrent, which is light dependent, but independent of the voltage across it. These effects become important when a solar cell 400 or solar cells 400 become shadowed, or when arrays are connected in parallel with other arrays of varying voltage outputs.

Figure 5:
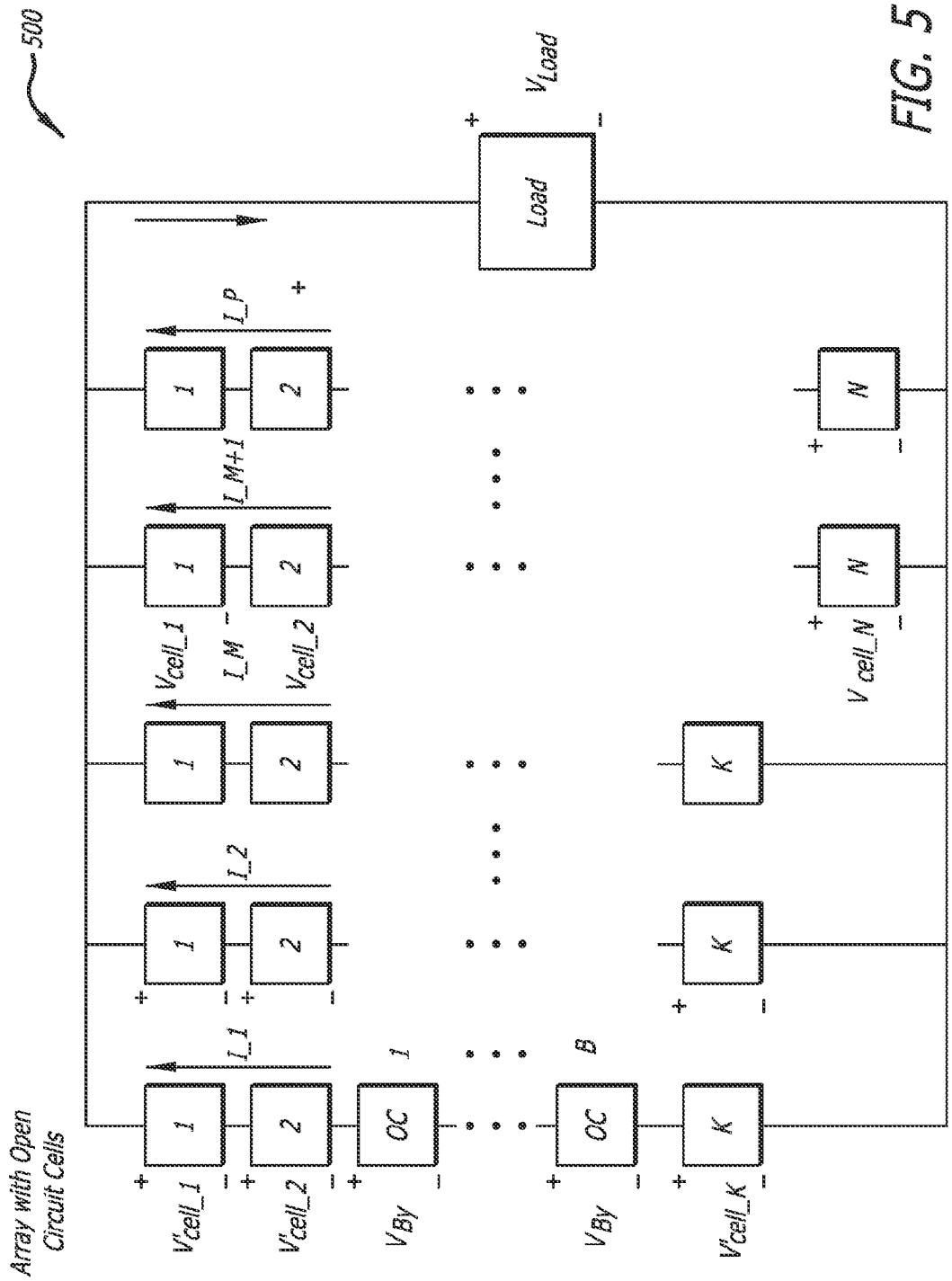
FIG. 5 is a depiction of a generalized version of a solar power array consisting of a plurality of solar cells, in accordance with at least one embodiment of the present disclosure.

FIG. 5 is a depiction of a generalized version of a solar power array 500 consisting of a plurality of solar cells, in accordance with at least one embodiment of the present disclosure. A mathematical model of the solar power array 500 in FIG. 5 can be constructed based on the simple model of Eq. 2-1. As such, the equations describing a fully illuminated field composed of P strings containing N cells is given by, $$I\_1 + I\_2 + \ldots I\_P = \frac{V_{Load}}{R_L}. \quad (2\text{-}2)$$

The current in each of the fully illuminated strings with N functioning cells with identical characteristics is given by, $$I = I_{sc} - I_o\left\{\exp\left[\frac{q\left(\frac{V_{Load} - (V_{od})}{N} + IR_s\right)}{mkT}\right] - 1\right\} - \frac{\left(\frac{V_{Load} + (V_{od})}{N} + IR_s\right)}{R_{sh}} \quad (2\text{-}3)$$

where,
I=string current
$V_{od}$=blocking diode voltage drop
N=number of cells in a string.

Numerical methods can be used to solve Eq. 2-2 using Eq. 2-3 for each of the current terms respectively. For this calculation, an additional term representing the bypass diode voltage (where power dissipation is proportional to current as is usually the case for large current diodes at direct current (DC)) may be added to the load voltage.

Figure 6:
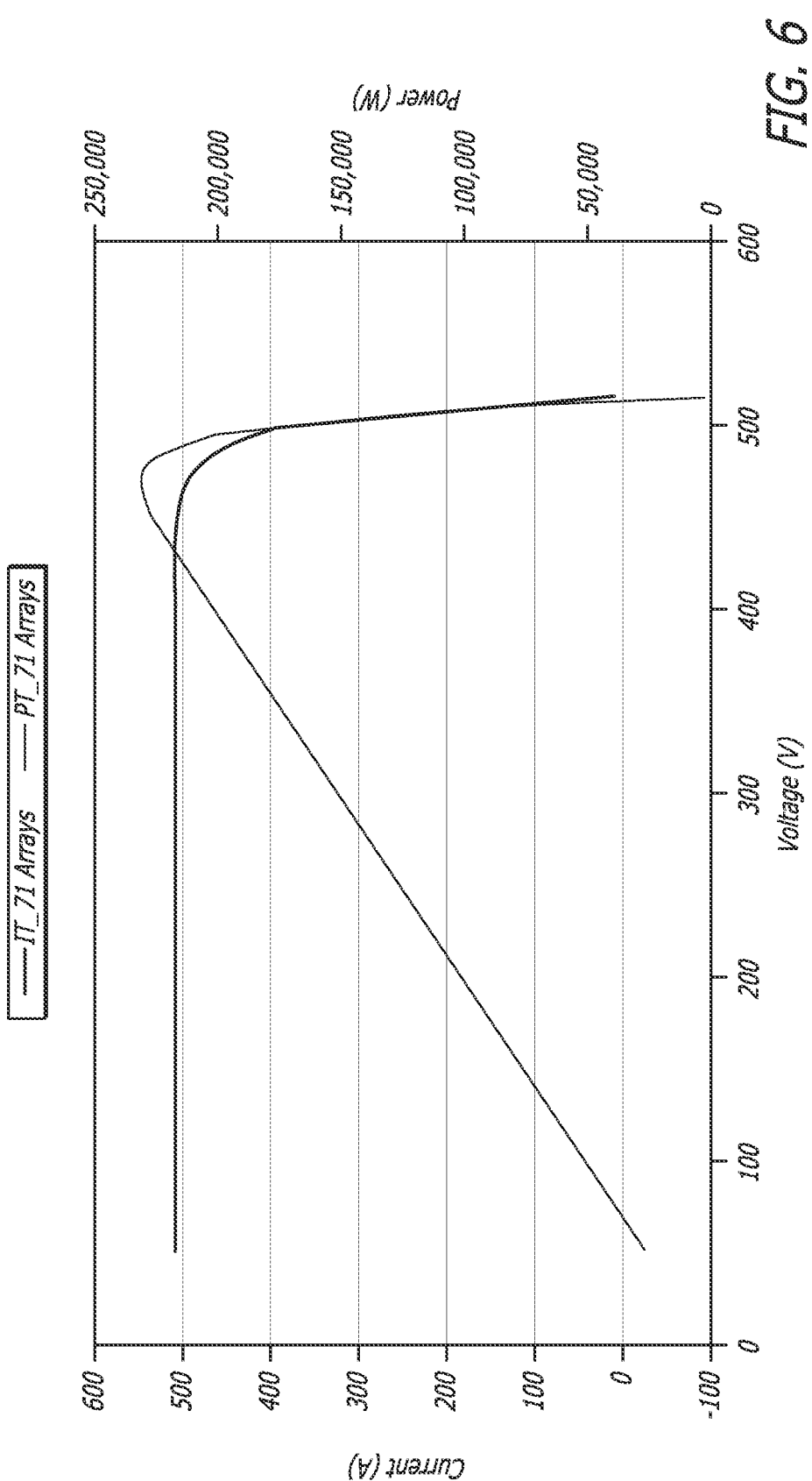
FIG. 6 is a graph showing the current and power for a simulated model of a solar power array, in accordance with at least one embodiment of the present disclosure.

FIG. 6 is a graph showing the current and power for a simulated model of a solar power array, in accordance with at least one embodiment of the present disclosure. In particular, FIG. 6 shows an exemplary current-voltage (IV) curve for a solar power array device model comprising 71 solar arrays connected in parallel, with each array including 144 solar cells connected in series. The IT curve shows the current through the load, and the PT curve shows the power delivered to the load. Peak power production corresponds to a specific load current and load voltage. The peak block power output is approximately 230,853 Watts (W) or 3,251.5 Watts (W) per array. This is the point of operation that the disclosed system will be operating (this point is set automatically by DC/AC inverter).

The model results are better than a practical implementation because of the absence of the series and shunt resistances. As a result, the model's form factor is about 86.4% and the power output is higher than a real array. However, this is a close enough approximation to demonstrate the theory underlying the elimination of bypass diodes.

The first step in the bypass diode elimination process is to identify a means to detect which solar cells in an array have failed (as with an open circuit situation). Without bypass diodes, one or more failed solar cells will block current from flowing into the load. Thus, sensing the absence of current identifies an array with one or more failed cells. Even if an array is heavily shaded, some finite current still flows, so the failure detection logic is still valid. Detection of a specific failed solar cell is more complicated, and requires sensing the voltage across each cell after a failure is detected, and comparing it with a known value. It can be shown that the voltage across a failed cell (it is assumed all cells are essentially identical) is given by, $$BV_{By} + LV_{oc} - V_{Load} = 0. \quad (2\text{-}3)$$

where,
B=number of failed cells in the array
$V_{By}$=voltage across a failed cell
L=number of operating cells in the array (2-4)
$V_{oc}$=cell open circuit voltage
$V_{Load}$=voltage across the load.

The total number of cells in the array is K such that, $$K = B + L. \quad (2\text{-}5)$$

From Eq. 2-3, the voltage across a failed cell is, $$V_{By} = \frac{V_{Load} - LV_{oc}}{B}. \quad (2\text{-}6)$$

Substituting Eq. 2-5 into (2-6) yields, $$V_{By} = \frac{V_{Load} - (K-B)V_{oc}}{B} \quad (2\text{-}7\text{ a, b, c, d})$$
$$= \frac{V_{Load}}{B} - \frac{K}{B}V_{oc} + V_{oc}$$
$$\frac{K}{B}\left(\frac{V_{Load}}{K} - V_{oc}\right) + V_{oc} = \frac{KV_{oc}}{B}\left(\frac{V_{Load}}{KV_{oc}} - 1\right) + V_{oc}.$$

The term $$\frac{V_{Load}}{KV_{oc}}$$

is recognized as the ratio of the maximum power load voltage to the optimum power load voltage that is used in the Form Factor equation. For the 71 array power block shown in FIG. 5, this ratio is about 0.9 under full illumination. It is smaller for actual arrays due to the effects of the series and shunt resistances. Using this value for the term, it is seen that, $$V_{By} = \frac{KV_{oc}}{B}(0.9 - 1) + V_{oc} = \left(1 - 0.1\frac{K}{B}\right)V_{oc}. \quad (2\text{-}8)$$

This equation shows that $V_{By}$ will be $$< 0 \text{ for } \frac{K}{B} > 10.$$

For example, if one solar cell ((B=1) out of 144 cells fails, then $$0.1\frac{K}{B} = 14.4.$$

The corresponding voltage is −13.4 V. If two cells fail (B=2), then the term is 7.2 and the voltage is −0.29 V. In summary, the voltage across the failed cell will be negative for up to 14 cell failures. In fact, if a failure threshold is set on $V_{By}$ at $$\frac{V_{oc}}{2}$$

it can be shown that more than 28 cells will have to fail before the threshold is exceeded, and the test would fail. It is clear that if individual solar cell voltages are sensed and found to be less than zero (i.e., negative) or below a specified threshold, and this fact is combined with the knowledge that no current is being produced in the array, then the solar cell is a failed (open circuited) solar cell.

If more than one cell fails in a single array over a 25-year life, then the design is faulty. The value of $V_{By}$ is used to determine if cell failure is not an issue. The fact that the ratio $$\frac{V_{Load}}{KV_{oc}}$$

for real systems is smaller the ideal value used here means that the number of cell failures yielding a negative cell voltage is much higher than 14, so this is not a limitation of the approach. More generally, Eq. 2-5 can be used to further extend the failed cell identification method to specific threshold voltages (non-negative) provided that the load voltage is measured as well since the other parameters are known a priori and deal with even more cell failures.

In comparison, the voltage across a fully functioning illuminated cell producing peak current is given by the equation, $$V_{cell} = \frac{mkT_{cell}}{q}\ln\left(\frac{I_{sc} - I_{cell} + I_{sh}}{I_o} + 1\right). \quad (2\text{-}9)$$

For the 71 array block, the individual solar cell voltage in the 70 functioning arrays is 3.254 V at the maximum power point, where the open circuit voltage is 3.572 V ($I_{sc}$ is 7.1309 A and $I_o$ is $1.7 \times 10^{-17}$ A). It is unlikely that a failed cell will be misidentified because of the large positive open circuit voltage of functioning cells in a no current state.

A similar situation occurs when a cell or group of cells is shaded and the photocurrent is reduced relative to the remaining fully functioning cells. Assuming that the array is operated near its peak power point, their voltage drops to near zero (since the load current exceeds the short circuit current for the shaded condition), or they become reversed biased. This limits the available current through the string if bypass diodes were not present to shunt current around the cell. However, since the solar cell is reversed biased, it is not producing power and its photocurrent simply reduces the amount of current through the shunt or bypass diode. Thus, these diodes act as a power consuming shunt across the shadowed solar cells.

In one or more embodiments, a failed solar cell or shadowed solar cell can be identified if both the current through an array and the voltage across each solar cell (or each module) in an array is known. If the current is zero and the voltage is negative across a solar cell, the solar cell is failed in an open circuit mode. A module with one or more solar cell failures can be treated the same way, but with a different voltage threshold level for a failure. Once a solar cell failure is detected, the required response is to create a low resistance shunt around the failed solar cell. This eliminates the power loss associated with a bypass diode.

If a solar cell is merely shaded and has not failed, its voltage will be less than its normal open circuit voltage, and the current in the array will be less than its peak power value. Thus, current measurements can be used to determine that one or more cells are being shadowed. If bypass diodes are not present across each cell, the voltage across the unshaded cells will also be reduced so that voltage measurements cannot be used to determine which cells are limiting array current. However, the shaded cells can be identified by trial and error using the process described in the following section.

In the case of a solar module, relatively more power will be lost if there are still functioning solar cells in the bypassed module containing the failed solar cell. However, this loss is relatively minor (~20 W), and will not affect the overall solar power plant output power significantly.

Figure 7A:
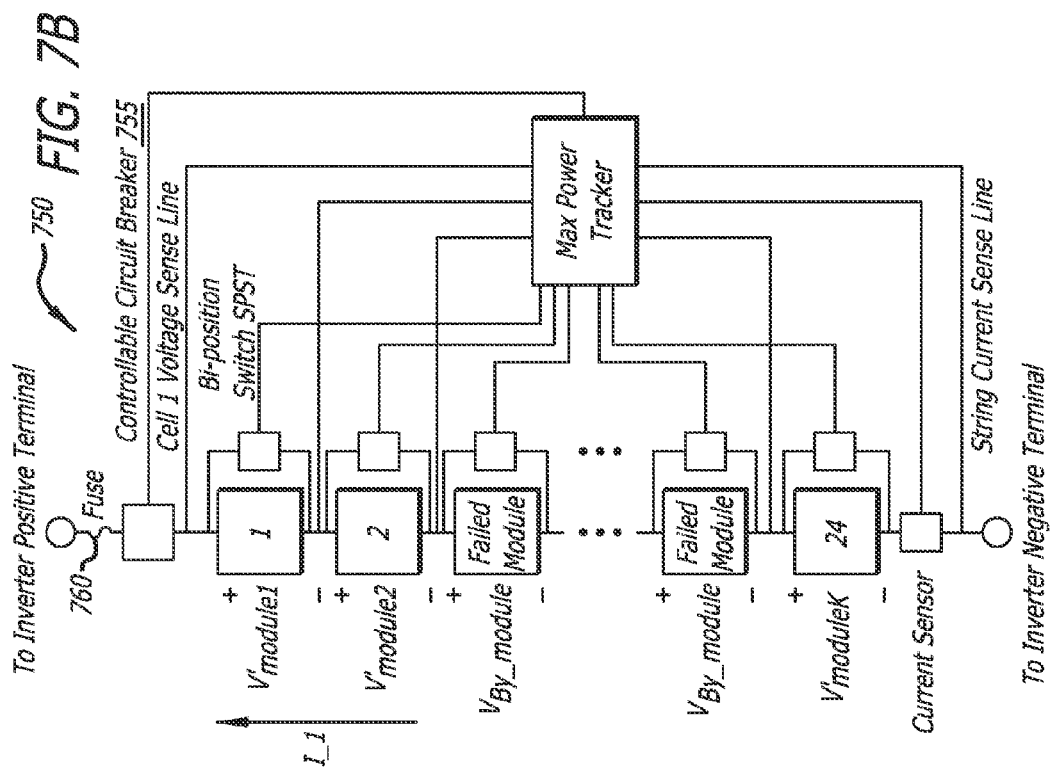
FIG. 7A illustrates a solar power array design with solar cell voltage sensing, in accordance with at least one embodiment of the present disclosure.
Figure 7B:
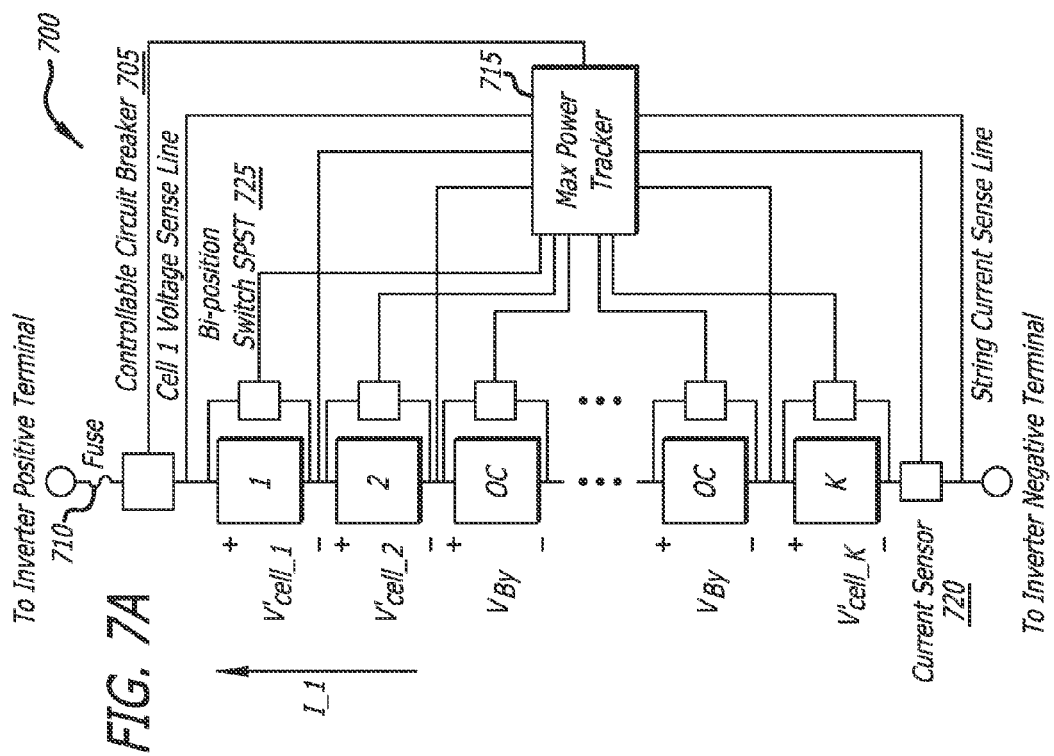
FIG. 7B depicts a solar power array design with module voltage sensing, in accordance with at least one embodiment of the present disclosure.

Two implementations of the diodeless concept are shown in FIGS. 7A and 7B that allow bypass diodes to be eliminated from the solar power array. Specifically, FIG. 7A illustrates a solar power array design 700 with solar cell voltage sensing, and FIG. 7B depicts a solar power array design 750 with module voltage sensing, in accordance with at least one embodiment of the present disclosure.

Both concepts also include a controllable circuit breaker 705, 755 at the solar power array's output to the inverter, and/or a fuse 710, 760 that are needed to eliminate the blocking diode. The concept implemented at the solar cell level is shown in FIG. 7A. It can be seen in this figure that the voltage across each solar cell is sensed by the controller 705 through the cell voltage sense lines. The maximum power tracker 715 already senses array current using the current sensor 720. Logic is included in the maximum power tracker's 715 software to determine if a failure has occurred, and which solar cell or solar cells have failed. The maximum power tracker then commands the bi-position switch 725 (e.g., a single-pole double-throw switch) to shunt current around each failed solar cell. Types of bi-position switches that may be used for the disclosed system include, but are not limited to, latching solenoids, latching relays, and read relays. Any device that will produce a short circuit across the failed solar cell with a small pulse of power, and then stay latched into that state without further power may be employed for the bi-position switches of this system. This device should also be capable of opening as well after being energized with a small burst of power, and then remain in the open state.

Another option for providing a shunt around a failed solar cell is to activate a latching solenoid using the current drawn from the operating array using a normally reversed biased diode across the solar cell, where the latching solenoid coils when the cell opens and will stop coiling when the latch closes the bypass shunt. However, the current draw of this device must also be small enough that it does not reduce the open circuit voltage in the failed array below the voltage of the cells in the fully illuminating arrays. If this occurs, then no current will flow though the device and this implementation may not be reversible.

FIG. 7B shows the concept implemented at the module level. This particular implementation reduces the number of voltage sense lines required and parts count at the expense of a slightly greater power loss if a module contains one or more failed solar cells. For the model solar power array, this means sensing voltage from 24 modules instead of 144 individual solar cells, which may be more practical since the voltage sense lines and bi-position switches can be located outside the module.

A potential simplification of the concept may be possible if the unit data "personalities" of each solar cell in a solar power array can be characterized, and remain stable over the life of the array. In this case, it may be possible to use only the array voltage and current to identify which of the solar cells (or modules) have failed since each solar cell (or module) will affect the solar power array's current and voltage in a unique fashion. For this operation, the maximum power tracker sequences through all possible solar cell failure states until the solar power array begins to function properly. This approach also is applicable to the identification of shaded solar cells. When the right combination of solar cells is shunted, solar power array current will experience a significant increase, thereby indicating that the shaded solar cells have been bypassed.

Having eliminated the need for bypass diodes and their power loss, it is possible to consider including a current-voltage (IV) curve measurement capability in the maximum power tracker for each solar cell or module in addition to a voltage sensor. With this information, a strategy to maximize the solar power array's overall power output can be implemented, and this will help to mitigate much of the problems associated with solar cell-to-cell and module-to-module variability. A simple strategy would be to short circuit a poorly performing solar cell that is limiting the remaining 143 solar cells in a model array from performing to their maximum potential. This may be required as solar cells degrade over the system's life. Another option is to have the maximum power tracker control the voltage across a solar cell or group of solar cells to produce a desired current output for each solar power array. In doing so, each solar power array could be maintained at its maximum output power point, and the inverter would not have to perform this function.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

We claim:

1. A method for providing a solar power array device without blocking diodes, the method comprising:
   providing a solar module;
   connecting a circuit breaker to the solar module;
   connecting a power bus and a controller to the circuit breaker;
   connecting an inverter to the power bus;
   sensing with the controller the output voltage and current of the solar module; and
   determining, with the controller, an amount of shadowing on the solar module by using a combination of the output voltage and the output current of the solar module,
   wherein when the controller determines that the amount shadowing on the solar module is less than a minimum shadowing threshold level, the controller sends a command to the circuit breaker to prevent current flow into the solar module.

2. The method of claim 1, wherein the inverter is a direct current/alternating current (DC/AC) inverter.

3. The method of claim 1, wherein the solar module contains a plurality of solar cells.

4. The method of claim 3, wherein the plurality of solar cells are connected in series.

5. The method of claim 3, wherein the plurality of solar cells are connected in parallel.

6. The method of claim 3, wherein the plurality of solar cells are connected in parallel-series combination.

7. The method of claim 1, wherein the solar module contains only one solar cell.

8. A method for providing a solar power array device without bypass diodes, the method comprising:
   providing a solar module;
   connecting a bi-position switch to the solar module;
   connecting a power bus and a controller to the bi-position switch;
   connecting an inverter to the power bus; and
   sensing with the controller the output voltage and current of the solar module,
   wherein when the controller senses that the maximum power of the solar module is less than a minimum bypass threshold level, the controller sends a command to the bi-position switch to bypass current around the solar module.

9. The method of claim 8, wherein the inverter is a direct current/alternating current (DC/AC) inverter.

10. The method of claim 8, wherein the solar module contains a plurality of solar cells.

11. The method of claim 10, wherein the plurality of solar cells are connected in series.

12. The method of claim 10, wherein the plurality of solar cells are connected in parallel.

13. The method of claim 10, wherein the plurality of solar cells are connected in parallel-series combination.

14. The method of claim 8, wherein the solar module contains only one solar cell.

15. The method of claim 8, wherein the bi-position switch is a latching solenoid.

16. The method of claim 8, wherein the at bi-position switch is a latching relay.

17. The method of claim 8, wherein the bi-position switch is a read relay.

18. A method for providing a solar power array device without blocking diodes and bypass diodes, the method comprising:
   providing a solar module;
   connecting a circuit breaker and a bi-position switch to the solar module;
   connecting a power bus and a controller to the circuit breaker and the bi-position switch;
   connecting an inverter to the power bus;
   sensing with the controller the output voltage and current of the solar module, wherein when the controller senses that the maximum power of the solar module is less than a minimum bypass threshold level, the controller sends a command to the bi-position switch to bypass current around the solar module; and determining, with the controller, an amount of shadowing of the solar module by using a combination of the output voltage and the output current of the solar module, wherein when the controller determines that the amount of shadowing on the solar module is less than a minimum shadowing threshold level, the controller sends a command to the circuit breaker to prevent current flow into the solar module.

19. The method of claim 18, wherein the inverter is a direct current/alternating current (DC/AC) inverter.

20. A solar power array device without blocking diodes, comprising:
   a solar module; a circuit breaker; a power bus; a controller; and an inverter,
   wherein the controller senses output voltage and current of the solar module,
   wherein the controller determines an amount of shadowing on the solar module by using a combination of the output voltage and the output current of the solar module,
   when the controller determines that the amount of shadowing on the solar module is less than a minimum shadowing threshold level, the controller sends a command to the circuit breaker to prevent current flow into the solar module.

* * * * *